US008669796B2

(12) United States Patent
Kanda

(10) Patent No.: US 8,669,796 B2
(45) Date of Patent: Mar. 11, 2014

(54) CLOCK GENERATOR, SEMICONDUCTOR DEVICE, AND CLOCK GENERATING METHOD

(71) Applicant: Renesas Electronics Corporation, Kawasaki (JP)

(72) Inventor: Yoshinori Kanda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/738,781

(22) Filed: Jan. 10, 2013

(65) Prior Publication Data

US 2013/0127505 A1 May 23, 2013

Related U.S. Application Data

(63) Continuation of application No. 13/032,270, filed on Feb. 22, 2011, now Pat. No. 8,378,722.

(30) Foreign Application Priority Data

Feb. 23, 2010 (JP) ................. 2010-037156

(51) Int. Cl.
*H03L 7/06* (2006.01)

(52) U.S. Cl.
USPC ......................................... 327/156

(58) Field of Classification Search
None
See application file for complete search history.

(56) References Cited

U.S. PATENT DOCUMENTS

| 4,278,839 | A | 7/1981 | Marik |
| 5,488,627 | A | 1/1996 | Hardin et al. |
| 7,095,260 | B2 | 8/2006 | Miyata et al. |
| 7,142,187 | B1 | 11/2006 | Kim et al. |
| 7,729,418 | B2 | 6/2010 | Watabe |
| 7,791,385 | B2 | 9/2010 | Huang et al. |
| 7,859,345 | B2 * | 12/2010 | Kawamoto ...................... 331/17 |
| 7,970,042 | B2 | 6/2011 | Hardin et al. |
| 8,024,598 | B2 | 9/2011 | Kim et al. |
| 8,269,536 | B2 * | 9/2012 | Huang et al. .................. 327/159 |
| 8,378,722 | B2 * | 2/2013 | Kanda ........................... 327/156 |
| 8,433,024 | B2 * | 4/2013 | Chiang et al. ................. 375/375 |
| 8,509,373 | B2 * | 8/2013 | Jeon et al. ..................... 375/376 |
| 2003/0058053 | A1 * | 3/2003 | Jeon et al. ....................... 331/17 |
| 2005/0168290 | A1 * | 8/2005 | Parikh ............................. 331/16 |
| 2006/0290393 | A1 * | 12/2006 | Yamamoto et al. ........... 327/156 |
| 2009/0207886 | A1 | 8/2009 | Cv et al. |
| 2011/0036151 | A1 | 2/2011 | Andle et al. |

FOREIGN PATENT DOCUMENTS

| JP | 56-500984 A | 7/1981 |
| JP | 7-235862 A | 9/1995 |
| JP | 2004-207846 A | 2/2004 |

OTHER PUBLICATIONS

Japanese Office Action issued Nov. 5, 2013 in corresponding Japanese Patent Application No. 2010-037156.

* cited by examiner

*Primary Examiner* — Lincoln Donovan
*Assistant Examiner* — Khareem E Almo
(74) *Attorney, Agent, or Firm* — Sughrue Mion, PLLC

(57) ABSTRACT

There is provided a clock generator for generating a modulation waveform which is high in the effect of suppressing a spectrum and making a circuit scale smaller than a modulation system using the Hershey-kiss waveform. More specifically, a modulation waveform generation unit generates a tangent waveform or a tangent+triangular waveform as an SSCG modulation waveform and provides an oscillator with a signal in which the SSCG modulation waveform is combined with the output of a low pass filter of a PLL loop.

9 Claims, 9 Drawing Sheets

CLOCK GENERATOR, SEMICONDUCTOR DEVICE, AND CLOCK GENERATING METHOD

CROSS-REFERENCE TO RELATED APPLICATIONS

This application is a Continuation of U.S. application Ser. No. 13/032,270 filed Feb. 22, 2011, which claims the benefit of priority from Japanese Patent Application No. 2010-37156 filed on Feb. 23, 2010 the contents of which are incorporated herein by reference in its entirety.

BACKGROUND

1. Field of the Invention

The present invention relates to a clock generation technique and, in particular, to a spread spectrum clock generator (abbreviated by SSCG), a semiconductor device equipped with the clock generator, and a clock generating method.

2. Description of the Related Art

In recent years, measures for electro-magnetic interference (EMI) have becomes more important along with improvement in operating frequency of a semiconductor device such as a large scale integrated circuit (LSI) and the like. A large number of printers, personal computers, and digital consumer electronic appliances, for example, is provided with a spread spectrum clock generator (SSCG) as measures for EMI. Since the internal clock signal of the LSI has a specific frequency, the spectrum of the clock has a peak in the specific frequency, which causes an electromagnetic radiation noise. The SSCG oscillates with the frequency of a clock slightly varied (frequency-modulated) to spread the energy of a spectrum into other frequencies, lowering the peak value in the specific frequency. A triangular waveform or a Hershey-kiss modulation waveform is often used for the modulation of frequency of a voltage controlled oscillator (VCO) whose oscillation frequency is varied by an applied control voltage.

FIG. 10 shows a Hershey-kiss waveform being a modulation waveform of the SSCG (FIG. 10 refers to FIG. 4 in Patent Document 1 in its entirety). In FIG. 10, an abscissa indicates the percentage of a period and an ordinate indicates the percentage of modulation deviation.

As discussed in Patent Document 1, a modulation circuit using the Hershey-kiss waveform adopts:
1) a method of changing the division ratio of a programmable counter in a feedback loop of a phase locked loop (PLL);
2) a method of generating a modulation waveform in an analog area; and
3) a method of inputting a digital code of a desired modulation waveform into a digital to analog converter FIG. 11 shows a configuration for changing the division ratio of the programmable counter in the feedback loop of the PLL (FIG. 11 refers to FIG. 6 in Patent Document 1 in its entirety). The PLL in FIG. 11 includes a programmable counter 35 on the side of reference clock and a programmable counter 42 on the side of a feedback loop. Their respective division ratios are set by lookup tables 46 and 47. The division ratios of the programmable counters 35 and 42 are changed during the operation of PLL, to spread the spectrum of output clock signal of a VCO 39. A Y1 (31) denotes a piezo crystal element used in an oscillation circuit (OSC) 33.

FIG. 12 shows a configuration for generating a modulation waveform in an analog area (FIG. 12 refers to FIG. 7 in Patent Document 1 in its entirety). An analog modulation circuit 52 generates a modulation waveform and adds the modulation waveform to the control voltage of a VCO 51 to spread the spectrum of output clock of the VCO 51.

The analog modulation circuit 52 triples the outputs of a triangular waveform generation unit and a log amplifier which are not shown and causes the tripled outputs to pass through an anti-log circuit to obtain the characteristic of cube of the Hershey-kiss. A phase detector 37, a filter 38, a VCO 39, and a programmable counter 42 form the loop of a PLL. A voltage in which the modulation waveform from the analog modulation circuit 52 is added to the control voltage input to the VCO 39 is applied to the VCO 51 for output, and output via a buffer 40.

FIG. 13 refers to FIG. 8 in Patent Document 1 in its entirety. An oscillation circuit 72 and an inverter 71 generate a clock signal. A clock signal in which the output of the inverter 71 is divided by a programmable counter 35 is input to the phase detector 37 in the PLL (the loop of the phase detector 37, the filter 38, the VCO 39, and the programmable counter 42) as a reference clock. The oscillation circuit 72 includes a variable capacity element (varactor diode D). The capacitance of the varactor diode D is varied with the output voltage of the analog modulation circuit 52. The capacitance of the varactor diode D is varied to vary the oscillation frequency of the oscillation circuit 72, thereby spreading the spectrum of output clock from the PLL. The analog modulation circuit 52 is similar to that in FIG. 12 in configuration.

FIG. 14 refers to FIG. 9 in Patent Document 1 in its entirety and shows an example in which a desired waveform of a digital code is input to a digital to analog converter (DAC) 83 and the output thereof is used. The desired digital code is input to the digital to analog converter 83 from a read only memory (ROM) 82. The digital to analog converter 83 generates an analog modulation waveform and adds the analog modulation waveform to the control voltage of the VCO 51 to spread the spectrum of output clock of the VCO 51.

[Patent Document 1] U.S. Pat. No. 5,488,627
[Patent Document 2] U.S. Pat. No. 4,278,839

SUMMARY

A related art is analyzed below.

In the PLL of the SSCG, when the direction at which the output frequency of the VCO is increased or decreased is changed by modulation, the output clock frequency of the VCO does not quickly follow sometimes. For this reason, peaks appear at the lower and upper limits of a band in which a spectrum is modulated to lower the amount of suppression (described later with reference to FIG. 5). This increases an electromagnetic radiation energy at portions where the peaks appear.

A modulation method using the Hershey-kiss waveform solves the above problem.

In an LSI onto which a ROM, for example, cannot be mounted, in a case where a modulation waveform is generated by an analog circuit, modulation using the Hershey-kiss waveform is performed in the analog modulation circuit 52 in FIGS. 12 and 13, as described above. In that case, the following is required;
1) a log amplifier
2) a triple amplifier,
3) an anti-log amplifier, and
4) triangular waveform oscillator The object of the present invention is to provide a clock generator, a semiconductor device, and a clock generating method which are capable of providing a modulation waveform high in the effect of suppressing a spectrum. According to the present invention, there is provided a clock generator and a semiconductor device which achieve the above object and makes a circuit scale smaller than a modulation system using the Hershey-kiss waveform.

According to the present invention, there is provided a clock generator which includes an oscillator configured to variably control the frequency of an oscillation clock thereof and a modulation waveform generation unit configured to generate a modulation waveform for modulating the frequency of oscillation clock of the oscillator, and which outputs a frequency-modulated clock signal from the oscillator based on the modulation waveform, wherein, the modulation waveform generation unit generates a tangent waveform or a waveform in which a tangent waveform is combined with a triangular waveform as the modulation waveform.

According to the present invention, there is provided a clock generating method including the step of: at the time of providing an oscillator for variably controlling a frequency with a signal waveform for frequency modulation to generate a frequency-modulated clock signal, using a tangent waveform or a waveform in which a tangent waveform is combined with a triangular waveform as the modulation waveform in which the amount of change in frequency per unit time is larger in the area before and after the upper limit of a frequency modulation range and the area before and after the lower limit of a frequency modulation range than in the other area.

According to the present invention, a modulation waveform which is high in the effect of suppressing a spectrum can be obtained. Furthermore, the present invention can make a circuit scale smaller than a modulation system using the Hershey-kiss waveform.

DETAILED DESCRIPTION OF THE PREFERRED EMBODIMENTS

The embodiment of the present invention is described below. According to one of the preferred modes of the present invention, referring to FIG. 1, there are provided an oscillator (a voltage control oscillator (VCO), for example) 15 of which the oscillation clock frequency is variably controlled and a modulation waveform generation unit 20 generating a modulation waveform for modulating the oscillation clock frequency of the oscillator (VCO) 15. The modulation waveform generation unit 20 generates a tangent (hereinafter abbreviated by "tan") waveform or a waveform composed of a tangent waveform and a triangular waveform, as a modulation waveform. More specifically, a signal in which a modulation waveform from modulation waveform generation unit 20 is combined with a signal with a level corresponding to a phase comparison result of a detector (phase/frequency detector) 12 between a reference clock to be input and an oscillation clock from the oscillator (VCO) 15 or a clock in which the oscillation clock is divided is input into the oscillator (VCO) 15 as a control signal (PLL control voltage) for varying a frequency, to generate a frequency-modulated clock signal from the oscillator (VCO) 15.

According to the present invention, the modulation waveform generation unit 20 generates a modulation waveform using a tan waveform or a tan+triangular waveform to increase the amount of change in frequency per unit time before and after the direction of change in frequency of the oscillator (VCO) 15 is switched (before and after the upper and lower limits of a frequency modulation range).

There are included a detector (phase/frequency detector) 12 which compares the phase or the phase and the frequency between a reference clock and an oscillation clock of the oscillator (VCO) 15 or a clock in which the oscillation clock is divided by a programmable counter 11, a charge pump 13 which generates a signal with a level corresponding to a comparison result of the detector (phase/frequency detector) 12, a first filter (low pass filter) 14 which smoothes the output signal of the charge pump 13, and a combining circuit (adder) 16 which supplies a signal in which the output signal of the first filter (low pass filter) 14 is combined with (added to) the output signal (SSCG modulation waveform) of the modulation waveform generation unit 20 to the oscillator (VCO) 15 as the control signal (PLL control voltage). The loop of the PLL (main path of the PLL) is formed of the oscillator (VCO) 15, the programmable counter 11 for dividing the oscillation clock, the detector (phase/frequency detector) 12, the charge pump 13, the first filter (low pass filter) 14, and the adder 16.

In the present embodiment, the modulation waveform can be generated by the following:
1) a method of obtaining the modulation waveform from a delta sigma ($\Delta\Sigma$) modulated pulse code;
2) a DAC method; and
3) an analog area.

Figure 7A:
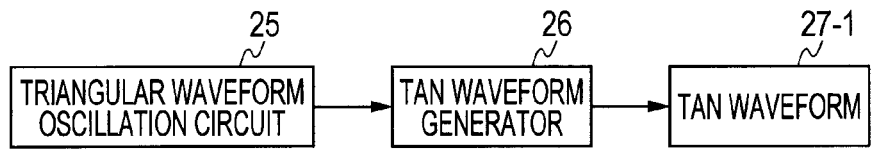
FIGS. 7A and 7B show a configuration of a third embodiment of the present invention.
Figure 7B:
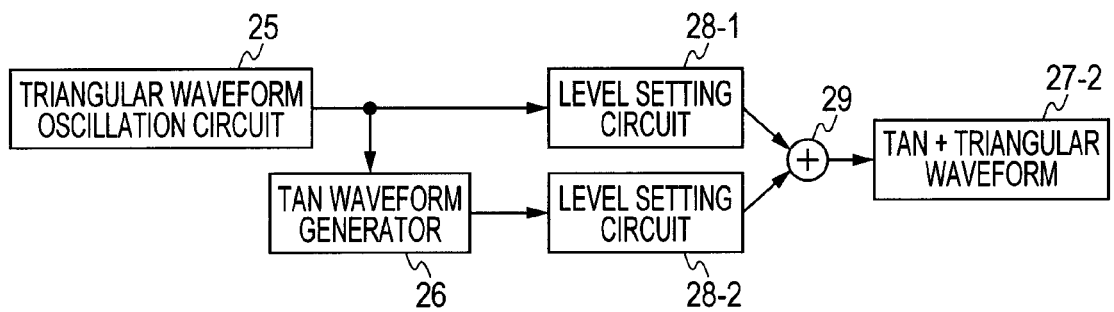

According to the present invention, as shown in FIGS. 7A and 7B, for example, the tan waveform or the tan+triangular waveform method includes a triangular waveform oscillation circuit 25 and a tan waveform generator 26 and can make a circuit scale smaller a modulation method using the Hershey-kiss.

In the SSCG, the frequency of output clock of the oscillator (VCO) 15 is varied by several percent, for example, from a frequency in a case where frequency modulation is not performed.

At this point, the frequency is periodically varied in the following manner:
(1) [an original frequency (=the frequency of a clock in a case where frequency modulation is not performed] is shifted to [a fast frequency];
(2) [the fast frequency] (the upper limit of a frequency modulation range) is returned to [the original frequency];

(3) [the original frequency] is shifted to [a slow frequency]; and then (4) [the slow frequency](the lower limit of a frequency modulation range) is returned to [the original frequency].

When the direction at which [the fast frequency] is changed to [the slow frequency] or [the slow frequency] is changed to [the fast frequency] is switched, however, the frequency of output clock from the oscillator (VCO) 15 does not quickly follow, so that peaks sometimes appear at the lower and upper limits of modulation range of a frequency spectrum of the output clock.

Figure 1:
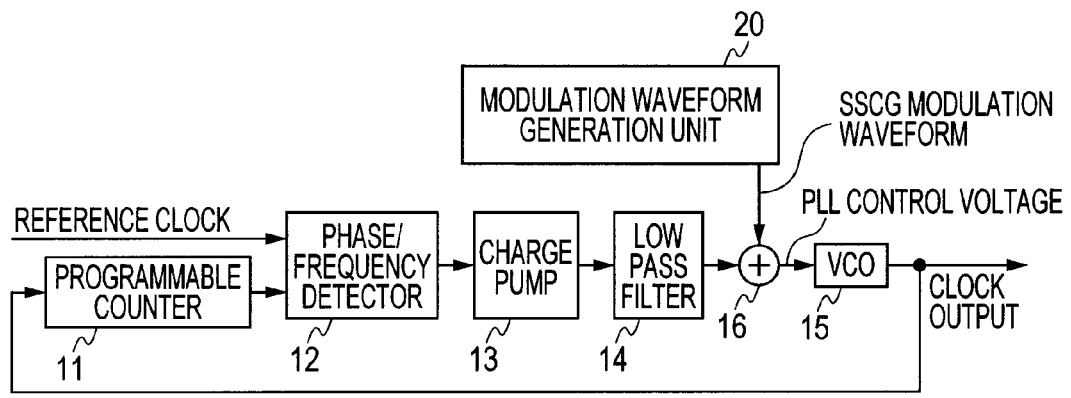
FIG. 1 shows a configuration of an embodiment of the present invention.

In an embodiment of the present invention, as shown in FIG. 1, the modulation waveform generation unit 20 generates a tan waveform or a waveform in which a triangular waveform is added to a tan waveform {tan θ+(ax+b)} or {tan θ+(−ax+c)}, as a modulation waveform. The term (ax+b) added to tan θ is a positive straight line in gradient and added to tan θ in the ranges of 0 to 90 degrees and 270 to 360 degrees in one period of frequency modulation of the oscillation clock. The term (−ax+c) is a negative straight line in gradient and added to tan θ in the range of 90 to 270 degrees.

A control voltage (PLL control voltage) in which a tan waveform or a waveform+a triangular waveform (SSCG modulation waveform) is added to the output voltage (voltage level corresponding to a frequency phase comparison result) of the first filter (low pass filter) 14 is applied to the oscillator (VCO) 15 to increase the amount of change in frequency per unit time before and after the direction of change in frequency is switched. For this reason, peaks of spectrum can be suppressed at the lower and upper limits of the frequency modulation range.

Figure 3:
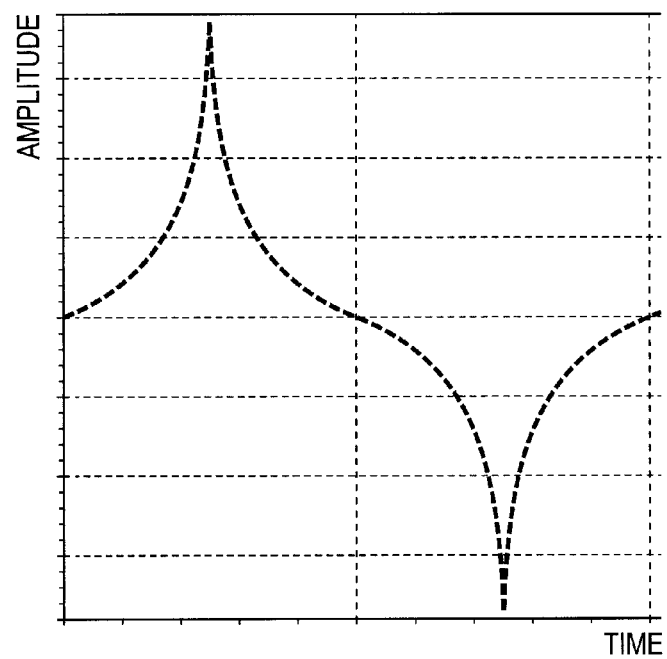
FIG. 3 shows a modulation waveform of a tan waveform.
Figure 4:
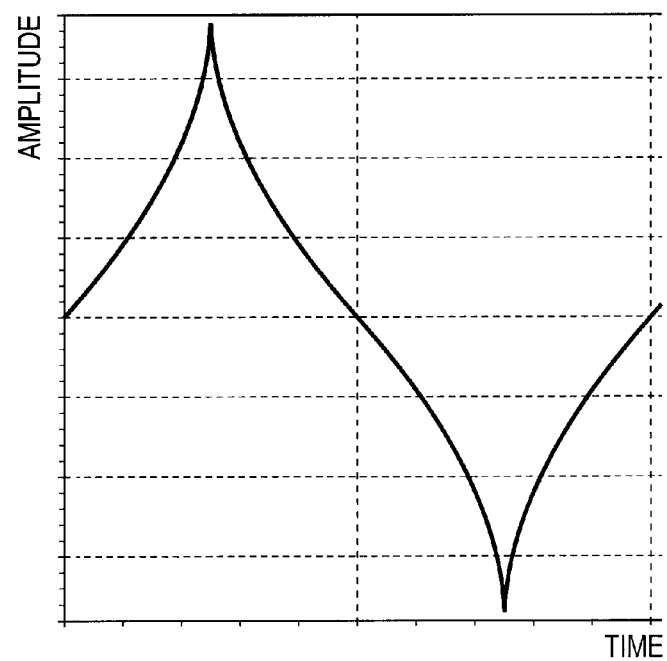
FIG. 4 shows a modulation waveform of a tan+triangular waveform.
Figure 10:
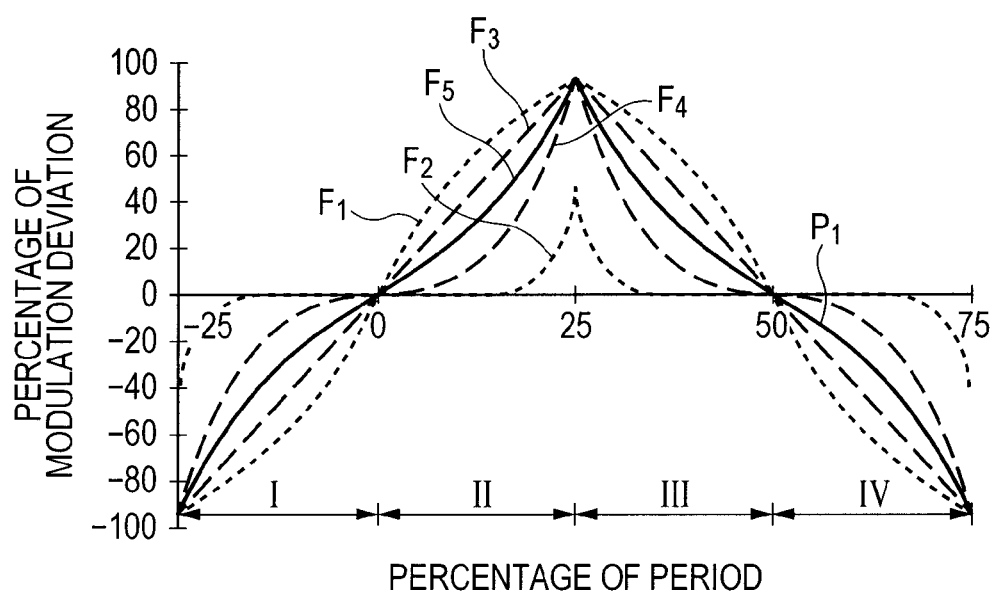
FIG. 10 shows a Hershey-kiss modulation waveform.
Figure 11:
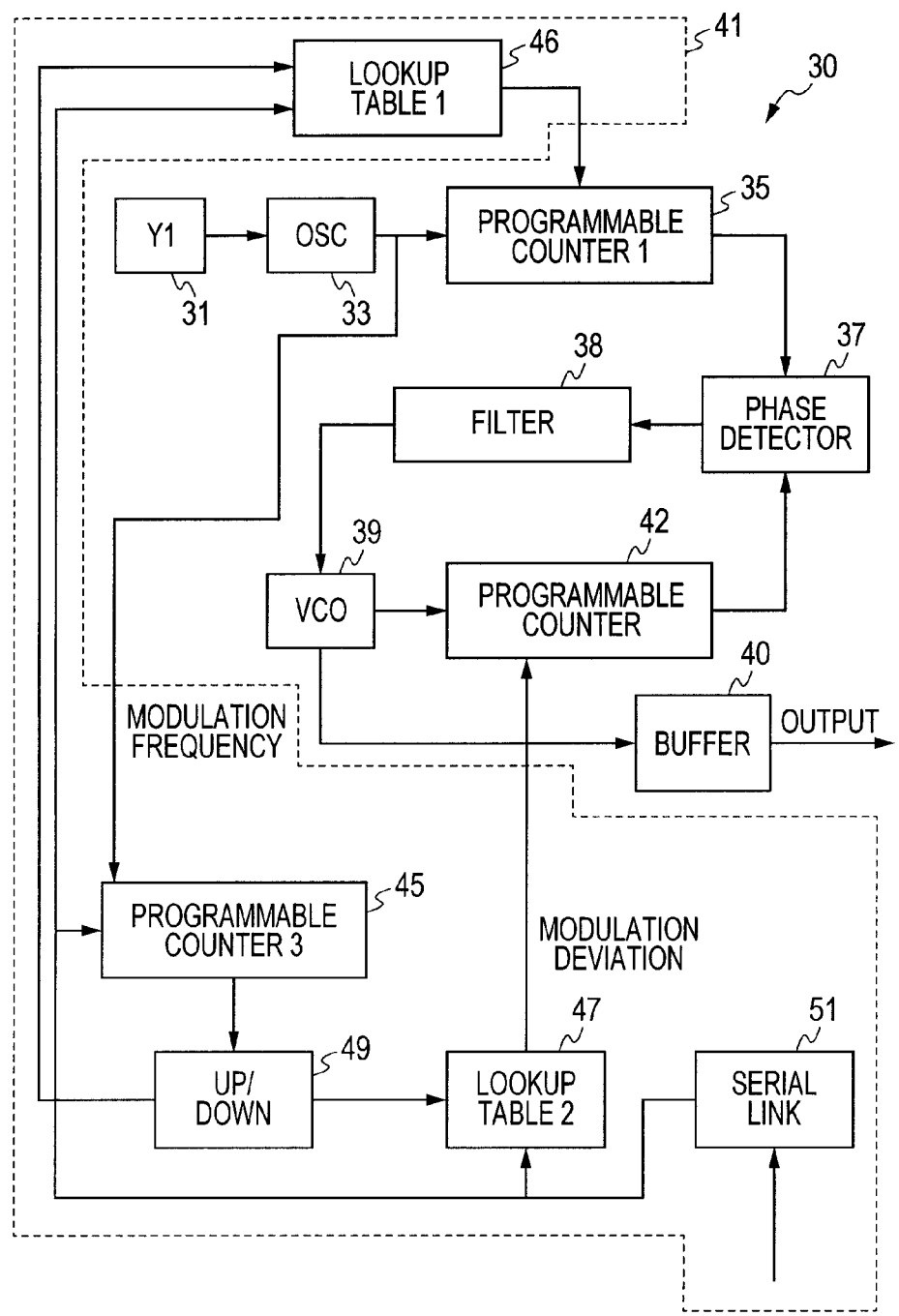
FIG. 11 is a first block diagram showing a configuration of a related art (Patent Document 1)
Figure 12:
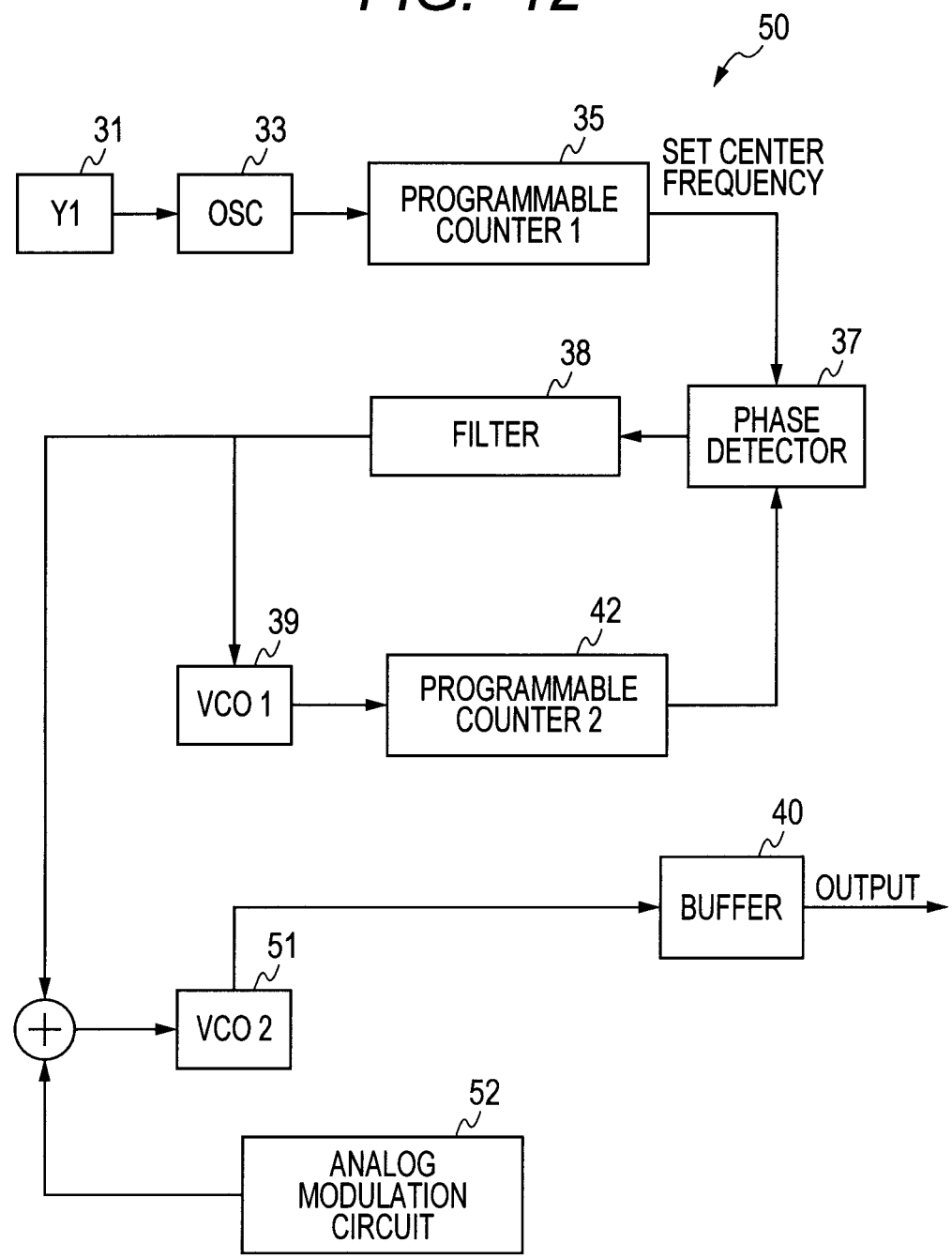
FIG. 12 is a second block diagram showing a configuration of a related art (Patent Document 1)
Figure 13:
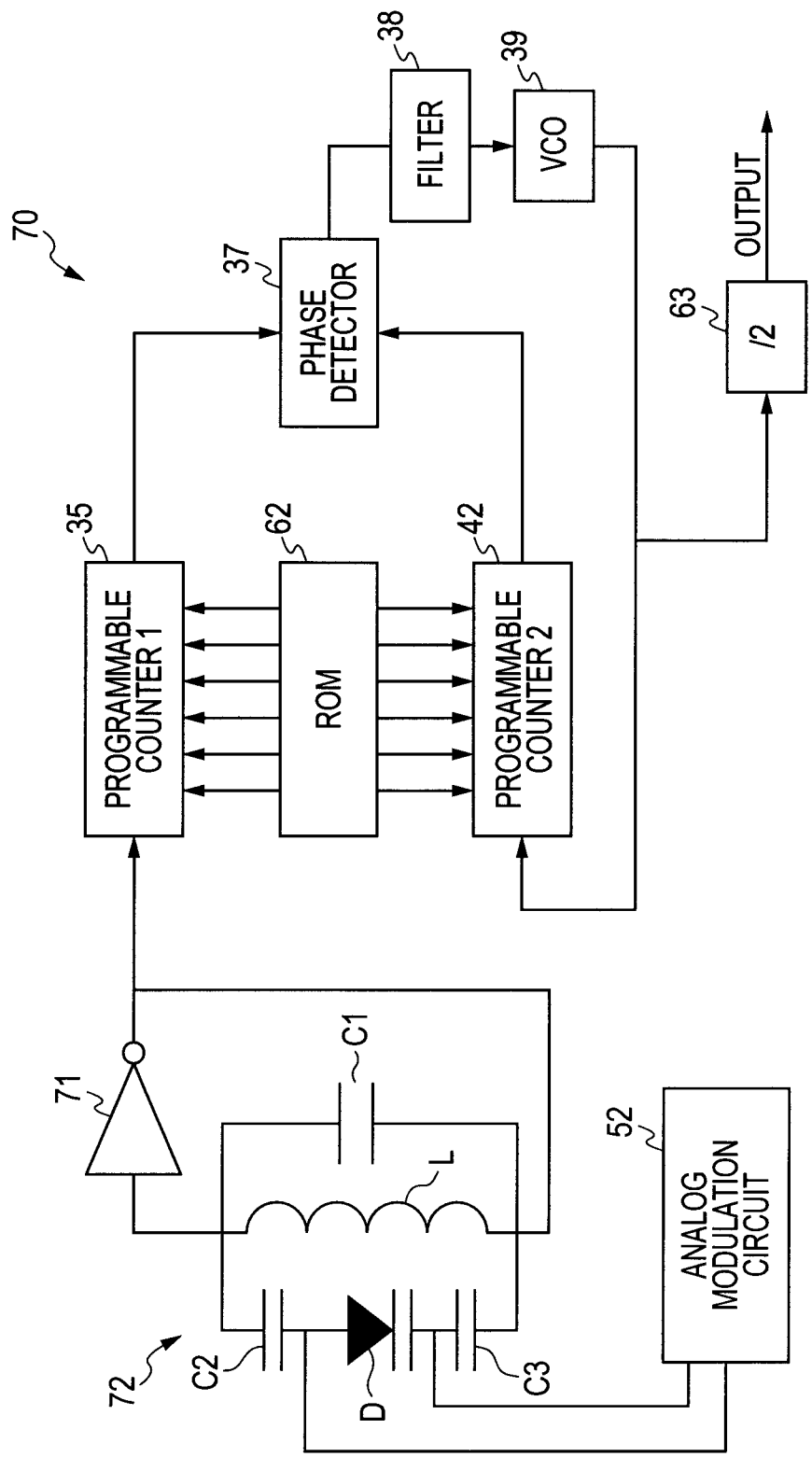
FIG. 13 is a third block diagram showing a configuration of a related art (Patent Document 1)
Figure 14:
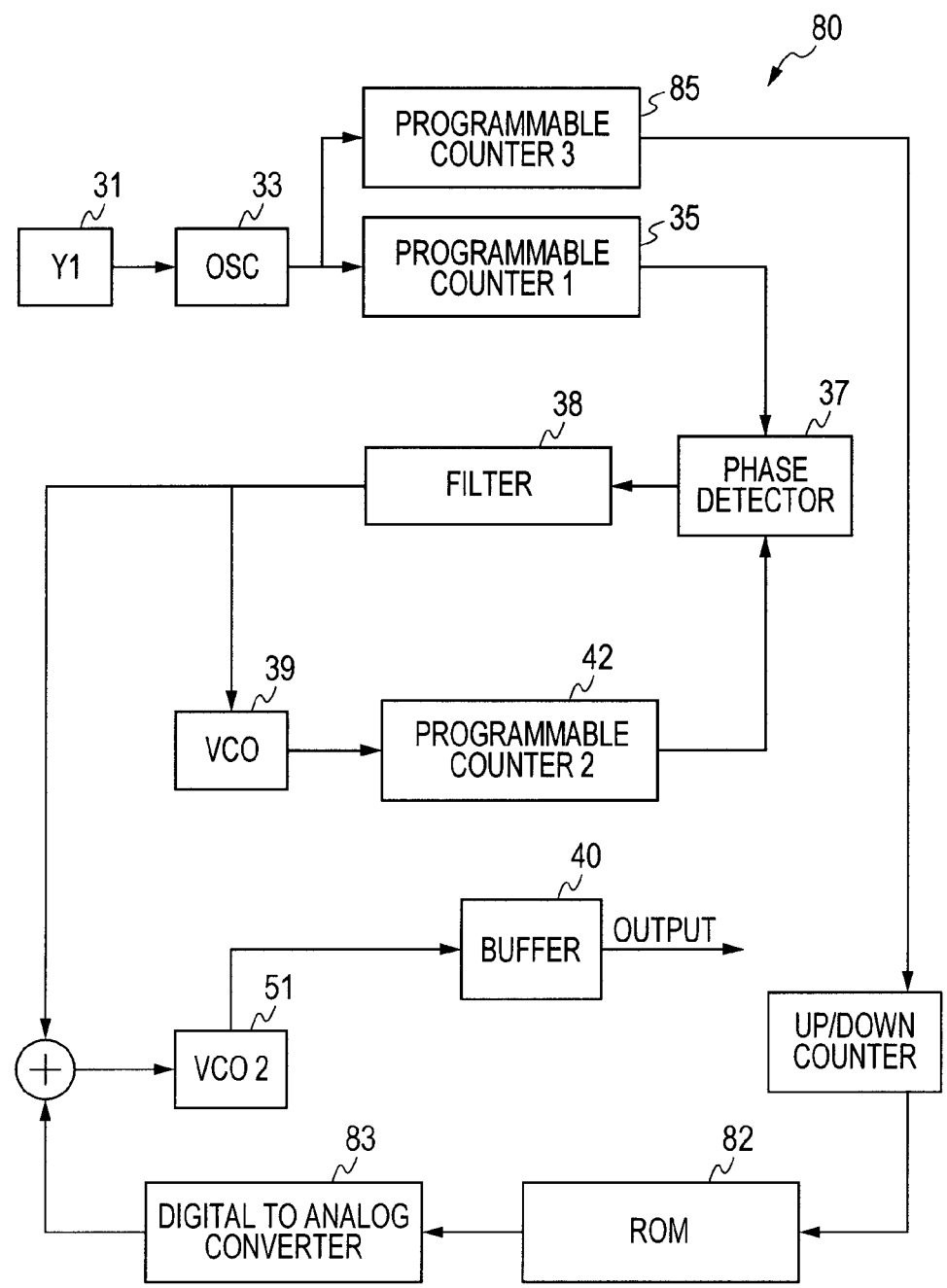
FIG. 14 is a fourth block diagram showing a configuration of a related art (Patent Document 1).

As shown in FIGS. 3 and 4, a tan waveform or a waveform in which a triangular waveform is added to the tan waveform is different from the waveform of the Hershey-kiss (FIG. 10).

In FIGS. 3 and 4, an abscissa indicates time (also corresponds to one period of frequency modulation and an angle θ with one period as 360 degrees) and an ordinate indicates the amplitude of a modulation signal. As shown in FIG. 3, tan θ provides positively and negatively the maximum and minimum values (the upper and lower limits of the frequency modulation range) at θ=90 degrees (=¼ period) and θ=270 degrees (=¾ period) respectively. As shown in FIG. 4, the waveform in which a triangular waveform is added to the tan waveform provides positively and negatively the maximum and minimum values (the upper and lower limits of the frequency modulation range) at θ=90 degrees (=¼ period) and θ=270 degrees (=¾ period) in the range of one period of frequency modulation respectively.

A turning point (the upper limit of the frequency modulation range) at which the frequency of output clock of the oscillator (VCO) 15 returns from [the fast frequency] to [the original frequency] in the above (2) corresponds to 90 degrees (=¼ period) in FIGS. 3 and 4. A turning point (the lower limit of the frequency modulation range) at which the frequency of output clock of the oscillator (VCO) 15 returns from [the slow frequency] to [the original frequency] in the above (4) corresponds to 270 degrees (=¾ period) in FIGS. 3 and 4. More specifically, it can be seen that the voltage amplitude (absolute value) of the modulation waveform is increased before and after the positions where the direction of change in frequency is switched (the upper and lower limits of a frequency modulation range) to increase the amount of change in frequency per unit time. Zero cross points (0 and 180 degrees) in FIGS. 3 and 4 correspond to the points where the frequency of output clock of the oscillator (VCO) 15 is [the original frequency].

In FIG. 1, the main path of the PLL is formed of the loop including a programmable counter 11 for dividing the oscillation clock from the oscillator (VCO) 15, the phase/frequency detector 12 for detecting a difference in frequency and phase between the reference clock and the division clock of the programmable counter 11, the charge pump 13 for outputting the signal with a level according to the difference in a frequency phase in the phase/frequency detector 12, the low pass filter (or a loop filter) 14 for smoothing the output of the charge pump 13, the adder (voltage adder) 16, and the VCO 15 whose oscillation frequency is variably controlled according to the PLL control voltage. Several embodiments are described below.

First Embodiment

Figure 2:
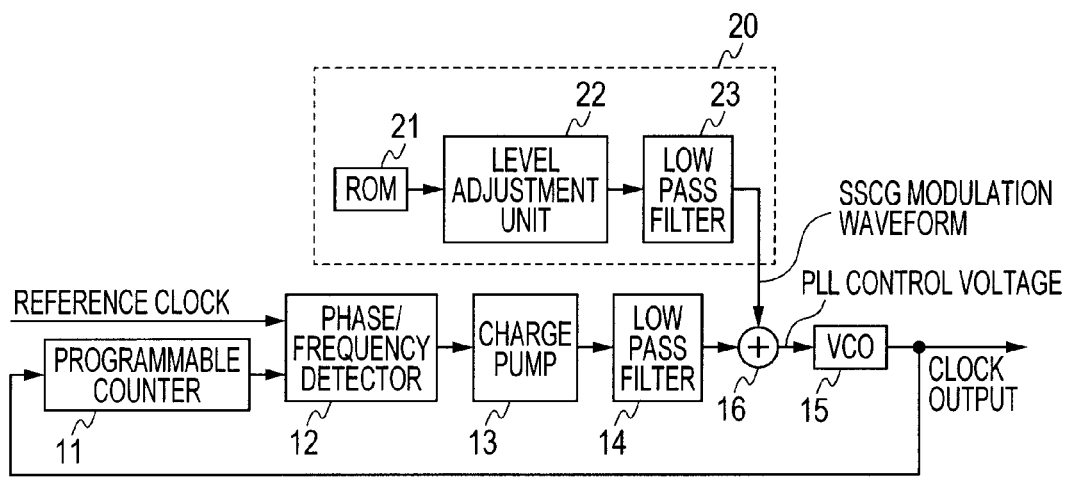
FIG. 2 shows a configuration of a first embodiment of the present invention.

FIG. 2 shows a configuration of a first embodiment of the present invention. FIG. 2 is a block diagram showing a specific example of the embodiment shown in FIG. 1 and a configuration in which the VCO of the SSCG is modulated by a tan waveform or a waveform in which a triangular waveform is added to a tan waveform (hereinafter, expressed as "tan+triangular waveform"). As is the case with the embodiment in FIG. 1, the present embodiment includes the modulation waveform generation unit 20 and the main path of the PLL. In FIG. 2, the components identical or equivalent to those in FIG. 1 are given the same reference numerals.

The modulation waveform generation unit 20 includes a read only memory (ROM) 21 into which a delta sigma (ΔΣ) modulated tan waveform or tan+triangular waveform is written, a level adjustment unit 22 for adjusting the amplitude level of output pulse of the ROM 21, and a low pass filter 23.

The main path of the PLL is formed of the programmable counter 11 for dividing the oscillation clock of the VCO 15, the phase/frequency detector 12 for comparing the frequency and phase between the division signal of the programmable counter 11 and the reference clock, the charge pump 13 for outputting the signal with a level according to a difference in a frequency phase, the low pass filter 14 for smoothing the output of the charge pump 13, the adder 16, and the VCO 15 whose oscillation frequency is variably controlled according to the control voltage (the PLL control voltage).

The control voltage (the PLL control voltage) of the VCO 15 is a voltage in which, using the adder 16, the output (SSCG modulation waveform) of the low pass filter 23 being the output of the modulation waveform generation unit 20 is added to that of the low pass filter 14 in the main path of the PLL.

In the present embodiment, a signal for generating a modulation waveform for spreading a spectrum (a tan waveform or a tan+triangular waveform) is stored in the ROM 21 as a signal (pulse code) in which a tan waveform or a tan+triangular waveform is delta sigma (ΔΣ) modulated.

The delta sigma (ΔΣ) modulation is the one in which an analog signal is over-sampled to spread the spectrum density of a quantization noise to a wide frequency band. The clock generator is provided with an integrator and a comparator (quantizer: one-bit quantizer, for example) and inputs a difference that the delayed signal of the comparator (quantizer) is subtracted from an input signal into the integrator. The delta sigma (ΔΣ) modulated 1-bit quantization data are passed through an analog filter (low pass filter) to reproduce an original analog signal waveform (in this case, a tan waveform or a tan+triangular waveform).

The level adjustment unit 22 reads a delta sigma (ΔΣ) modulated code (a code for generating a tan waveform or a tan+triangular waveform) from the ROM 21, adjusts the amplitude level thereof, causes the code to pass through the low pass filter (analog filter) 23, returning the code to a voltage waveform of a tan waveform or a tan+triangular waveform. FIG. 3 shows a modulation waveform of a tan waveform. FIG. 4 shows a modulation waveform of a tan+triangular waveform. In FIGS. 3 and 4, an abscissa indicates time (or an angle denoting one period by 360) and an ordinate indicates a voltage of a modulation signal (corresponding to the deviation of the frequency modulation (modulation rate)).

When the abscissa is taken as 0 to 360 degrees corresponding to one period of the frequency modulation, the tan waveform shown in FIG. 3 is maximized positively and negatively at 90 degrees (¼ period) and 270 degrees (¾ period) respectively and zero-crossed at 0 degrees (0 period), 180 degrees (½ period), and 360 degrees (1 period).

The tan+triangular waveform shown in FIG. 4 is the one in which a positive triangular waveform which is positively maximized at 90 degrees (¼ period) and zero-crossed at 0 degrees (0 period) and 180 degrees (½ period) is superimposed on the tan waveform and a negative triangular waveform which is negatively maximized in absolute value at 270 degrees (¾ period) and zero-crossed at 180 degrees (½ period) and 360 degrees (1 period) is superimposed on the tan waveform.

The tan waveform or the tan+triangular waveform (SSCG modulation waveform) from the low pass filter 23 is added to the output signal of the low pass filter 14 by the adder 16 and the added waveform and signal is supplied to the VCO 15 as a control voltage. In FIG. 2, if the modulation waveform generation unit 20 generates a waveform which is 180-degree out of phase from the tan waveform or the tan+triangular waveform (reversed-phase waveform) shown in FIGS. 3 and 4 as the SSCG modulation waveform, the adder 16 in FIG. 2 is formed by a subtracter in which the SSCG modulation waveform subtracted from the output signal of the low pass filter 14 is supplied to the VCO 15 as the PLL control voltage.

As stated above, in the SSCG, the frequency of output clock of the VCO 15 is changed by several percent with respect to the frequency in a case where the frequency thereof is not modulated. More specifically, the frequency of output clock of the VCO 15 is periodically changed in the following order: [original frequency (=a clock frequency in a case where the frequency is not modulated)], [fast frequency], [original frequency], [slow frequency], and [original frequency].

Figure 5:
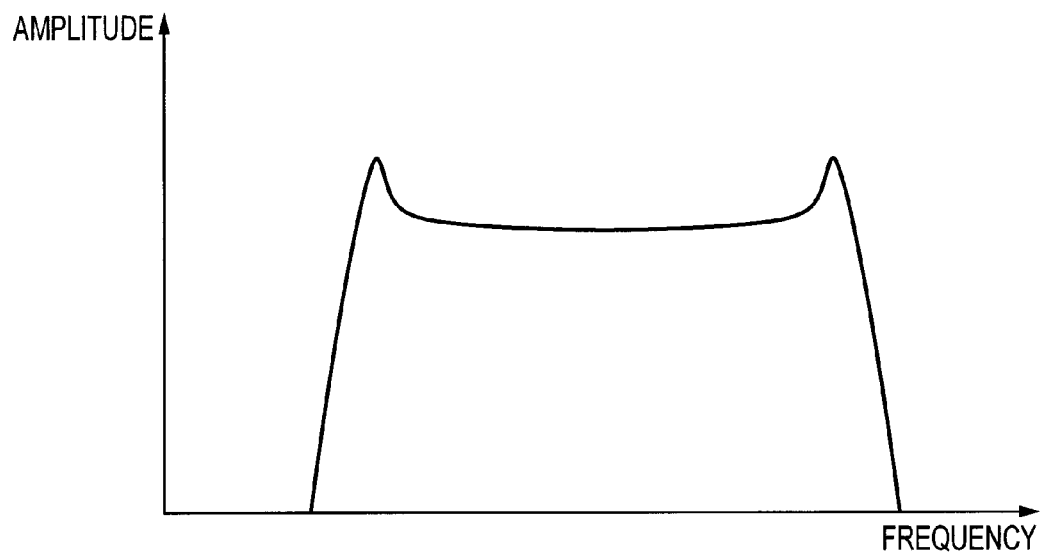
FIG. 5 is a chart showing an example with peaks at the lower and upper limits of a band modulated by an SSCG.

When the direction at which [the fast frequency] is changed to [the slow frequency] or [the slow frequency] is changed to [the fast frequency] is switched, the frequency of output clock from the VCO 15 does not quickly follow, peaks appear at the lower and upper limits of a band in which a spectrum is modulated to lower the amount of suppression, as shown in FIG. 5. This increases an electromagnetic radiation energy at portions where the peaks appear (the lower and upper limits of a band in which a spectrum is modulated in FIG. 5).

According to the present embodiment, the oscillation frequency of the VCO 15 is modulated by the modulation waveform of the tan waveform (tan θ) or the tan+triangular waveform {tan θ+(ax+b) or tan θ+(−ax+c)} to increase the amount of change in frequency per unit time before and after the direction of change in oscillation frequency is switched, thereby enabling quickly following the oscillation frequency of the VCO 15. For this reason, according to the present embodiment, the peaks of a spectrum can be suppressed at the lower and upper limits of the frequency modulation range.

Second Embodiment

Figure 6:
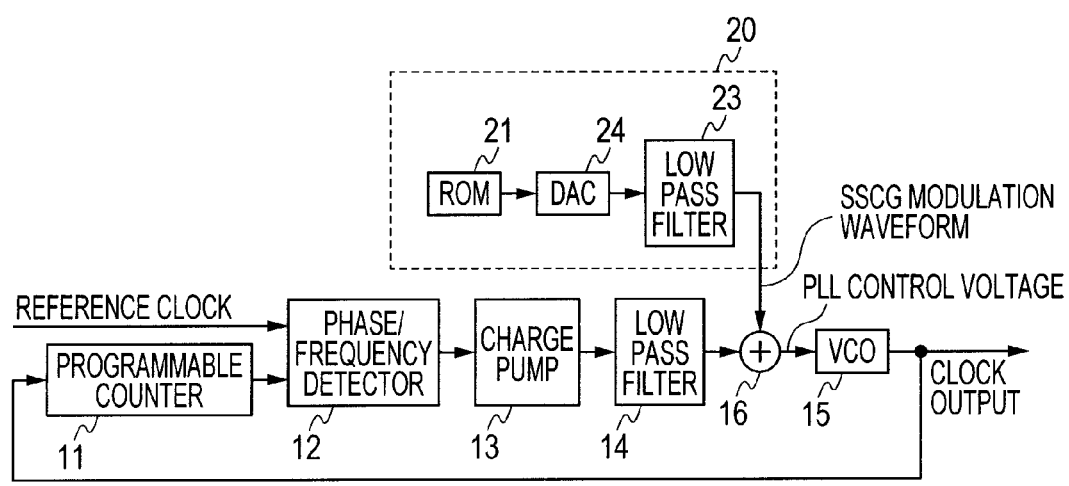
FIG. 6 shows a configuration of a second embodiment of the present invention.

The second embodiment of the present invention is described below. FIG. 6 shows a configuration of the second embodiment of the present invention. In FIG. 6, the components identical or equivalent to those in FIG. 1 are given the same reference numerals. The modulation waveform generation unit 20 in the present embodiment is different in configuration from that in the first embodiment.

Referring to FIG. 6, the modulation waveform generation unit 20 includes a ROM 21 in which the codes of a tan waveform or a tan+triangular waveform are stored, a digital to analog converter (DAC) 24 for outputting an analog waveform from the codes of a tan waveform or a tan+triangular waveform read from the ROM 21, and a low pass filter 23. The main path of the PLL is similar to that in FIG. 2. The control voltage (PLL control voltage) of the VCO 15 is the output of the adder 16 that the output of the modulation waveform generation unit 20 (SSCG modulation waveform) is added to the output of the low pass filter 14 in the main path of the PLL.

In the first embodiment, the ROM 21 stores a code in which a modulation waveform for spreading a spectrum (a tan waveform or a tan+triangular waveform) is delta sigma (ΔΣ) modulated. In the present embodiment, however, the ROM 21 stores a digital code in which a modulation waveform for spreading a spectrum (a tan waveform or a tan+triangular waveform) is sampled.

The DAC 24 converts the code of a tan waveform or a tan+triangular waveform (digital signal series) read from the ROM 21 into an analog signal voltage and outputs the analog voltage waveform of modulation waveform (a tan waveform or a tan+triangular waveform). The low pass filter 23 (also referred to as "reconstruction filter") for receiving the analog output signal from the DAC 24 cuts off unnecessary high frequencies higher than ½ or more of the sampling frequency in the analog output signal of the DAC 24. The output signal (analog output voltage) of the low pass filter 23 is input to the adder 16 as the SSCG modulation waveform and added to the output voltage of the low pass filter 14. The frequency of output clock of the VCO 15 is periodically changed in the following order: [original frequency (=a clock frequency in a case where the frequency is not modulated)], [fast frequency], [original frequency], [slow frequency], and [original frequency].

According to the present embodiment, as is the case with the first embodiment, the frequency of the VCO 15 is modulated by the modulation waveform of the tan waveform or the tan+triangular waveform {(tan θ+ax+b) or (tan θ−ax+c)} to increase the amount of change in frequency per unit time before and after the direction of change in frequency is switched. For this reason, according to the present embodiment, the peaks of a spectrum can be suppressed at the lower and upper limits of the frequency modulation range.

Third Embodiment

The third embodiment of the present invention is described below. As the third embodiment, a configuration in which the modulation waveform generation unit 20 for generating a tan waveform or a modulation waveform in which a triangular waveform is added to a tan waveform is formed in an analog area is described below. FIGS. 7A and 7B show a configuration of portions for generating a tan waveform or a modulation waveform of a tan+triangular waveform.

FIG. 7A shows a configuration in which the modulation waveform generation unit 20 generates a tan waveform as a modulation waveform. A triangular waveform oscillation circuit 25 oscillates and outputs a triangular waveform. The triangular waveform oscillation circuit 25 alternately sweeps and outputs a positive triangular waveform which zero crosses at 0 degrees and 180 degrees of one period (360 degrees) of frequency modulation and reaches the maximum value at 90 degrees and a negative triangular waveform which zero crosses at 180 degrees and 360 degrees and reaches the minimum value (amplitude maximum value) at 270 degrees every half a period.

Figure 9:
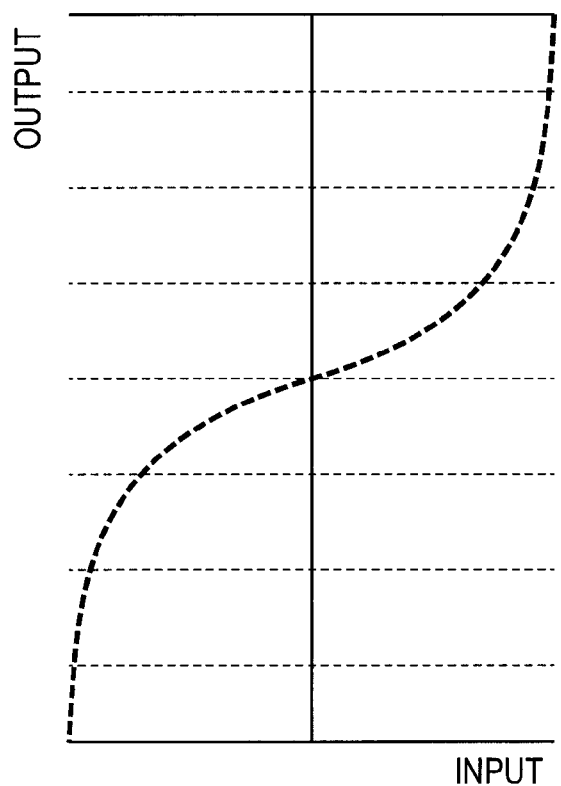
FIG. 9 is a chart showing the input and output characteristic (analog area) of the tan waveform generator.

The swept triangular waveform from the triangular waveform oscillation circuit 25 is input to a tan waveform generator 26. The tan waveform generator 26 has input and output characteristics (the abscissa indicates input and the ordinate indicates output which show input and output voltages respectively, for example) shown in FIG. 9. A tan waveform 27-1 (corresponding to the modulation waveform of the tan waveform) is output from the tan waveform generator 26 to which the swept triangular waveform is input from the triangular waveform oscillation circuit 25.

Figure 8:
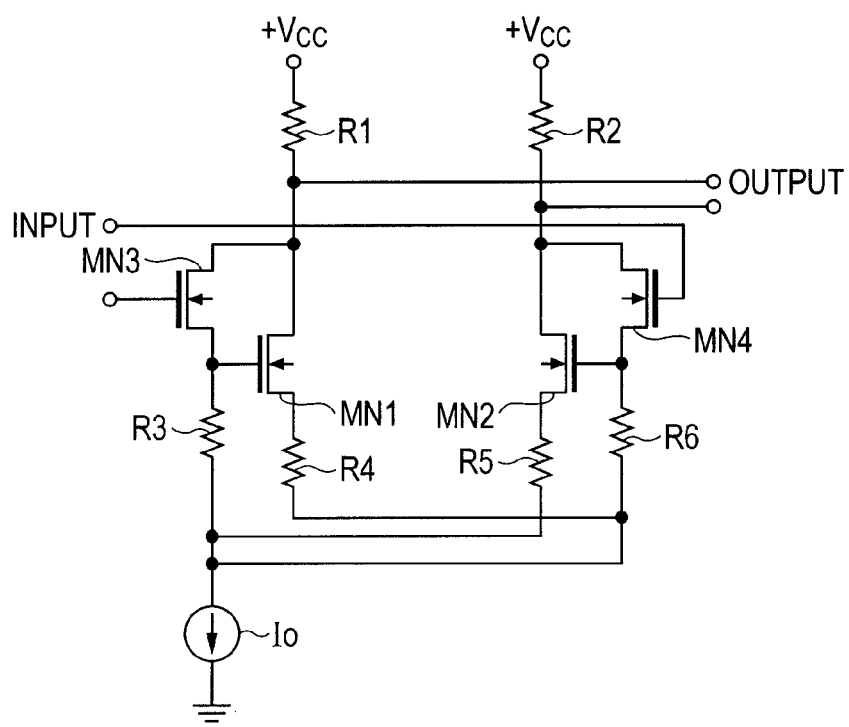
FIG. 8 shows a configuration of a tan waveform generator (analog area) in FIG. 7A.

FIG. 8 shows an example of a configuration of the tan waveform generator 26 shown in FIG. 7A. The circuit shown in FIG. 8 is the one in which the circuit (bipolar transistor) discussed in Patent Document 2 is formed by a metal-oxide semiconductor (MOS).

Referring to FIG. 8, the tan waveform generator 26 includes: nMOS transistors MN1 and MN2 whose gates are coupled to the other ends of resistors R3 and R6 respectively whose one ends are coupled to the other ends of a current source Io whose one end is coupled to ground; and nMOS transistors MN3 and MN4 whose sources are coupled to the other ends of resistors R3 and R6 respectively. The drains of the nMOS transistors MN1 and MN3 are commonly coupled to one end of a resistor 1 and the other end of the resistor 1 is coupled to a power supply VCC. The drains of the nMOS transistors MN2 and MN4 are commonly coupled to one end of a resistor 2 and the other end of the resistor R2 is coupled to the power supply VCC. The source of the nMOS transistor MN1 is coupled to one end of the resistor R4 and the other end of the resistor R4 is coupled to one end of the resistor R6. The source of the nMOS transistor MN2 is coupled to one end of the resistor R5 and the other end of the resistor R5 is coupled to one end of the resistor R3. An input signal INPUT is differentially input to the gates of the nMOS transistors MN3 and MN4. An output signal OUTPUT is differentially output from the drains of the nMOS transistors MN3 and MN4. It is needless to say that the tan waveform generator 26 may be formed of bipolar transistors as discussed in Patent Document 2. The triangular waveform output from the triangular waveform oscillation circuit 25 in FIG. 7A is differentially input to the gates of the nMOS transistors MN3 and MN4. The tan waveform is differentially output from the drains of the nMOS transistors MN3 and MN4.

FIG. 7B shows a configuration in which the modulation waveform generation unit 20 generates a tan+triangular waveform as a modulation waveform. The triangular waveform oscillation circuit 25 and the tan waveform generator 26 are similar in configuration to those in FIG. 7A. A level setting circuit 28-1 adjusts the level of the triangular waveform from the triangular waveform oscillation circuit 25. For the triangular waveform, a positive triangular waveform which zero crosses at 0 degrees and 180 degrees of one period (360 degrees) of frequency modulation and reaches the maximum value at 90 degrees and a negative triangular waveform which zero crosses at 180 degrees and 360 degrees and reaches the minimum value (amplitude maximum value) at 270 degrees are alternately output every half a period. The tan waveform generator 26 to which the swept triangular waveform is input from the triangular waveform oscillation circuit 25 has the foregoing circuit configuration in FIG. 8, for example, and outputs the tan waveform whose level is adjusted by a level setting circuit 28-2. The triangular waveform and the tan waveform whose levels are adjusted by the level setting circuits 28-1 and 28-2 are input to an adder (a second adder) 29 and added to each other. The adder 29 outputs a tan+triangular waveform 27-2 (corresponding to the modulation waveform of the tan+triangular waveform in FIG. 4).

According to the present invention, the modulation waveform of the tan waveform or the tan+triangular waveform is used to allow acquiring the modulation method high in a spectrum suppression effect without use of the modulation waveform of the Hershey-kiss.

The disclosure of the above Patent Documents is incorporated herein by reference in its entirety. Modifications and adjustments of the embodiments may be made within all disclosures (including claims) of the present invention based on the basic technical concept of the present invention. A variety of combinations and selections of various disclosed elements may be made within the claims of the present invention. It is to be understood that the present invention includes various modifications which will be apparent to those skilled in the art according to all disclosures including claims and the technical concept.

What is claimed is:

1. A clock generator comprising:
    an oscillator variably controlling the frequency of an oscillation clock thereof; and
    a modulation waveform generation unit generating a modulation waveform for modulating the frequency of oscillation clock of the oscillator,
    the clock generator outputting a frequency-modulated clock signal from the oscillator based on the modulation waveform,
    wherein the modulation waveform is configured such that the amount of change in frequency per unit time is larger in the area before and after the upper limit of a frequency modulation range and the area before and after the lower limit of a frequency modulation range than in the other area.

2. The clock generator according to claim 1, further comprising:
    a detector comparing phase or phase and frequency between a reference clock to be input and the oscillation clock from the oscillator or the clock in which the oscillation clock is divided;
    a charge pump generating a signal with a level corresponding to a comparison result of the detector;
    a first filter smoothing the output of the charge pump; and
    a circuit supplying a signal in which the output signal of the first filter is combined with the modulation waveform of the modulation waveform generation unit as a control signal for varying a frequency.

3. The clock generator according to claim 1,
    wherein the modulation waveform generation unit comprises:
    a storage unit storing a signal obtained by delta-sigma modulating a tangent waveform or a waveform in which a tangent waveform is combined with a triangular waveform; and
    a second filter,
    wherein the delta-sigma modulated signal stored in the storage unit is read and passed through the second filter to reproduce a tangent waveform or a waveform in which a tangent waveform is combined with a triangular waveform from the second filter.

4. The clock generator according to claim 3, further comprising:
    a level adjustment unit adjusting the level of a signal read from the storage unit.

5. The clock generator according to claim 1,
wherein the modulation waveform generation unit comprises:
a storage unit storing a tangent waveform or a waveform in which a tangent waveform is combined with a triangular waveform as digital signals; and
a digital to analog converter receiving the digital signal stored in the storage unit and outputting an analog signal waveform.

6. The clock generator according to claim 5, further comprising:
a third filter receiving the analog signal output from the digital to analog converter and outputting the modulation waveform formed by a tangent waveform or a waveform in which a tangent waveform is combined with a triangular waveform.

7. The clock generator according to claim 1,
wherein the modulation waveform generation unit comprises:
a triangular waveform oscillation circuit oscillating and outputting a triangular waveform; and
a tangent waveform generator receiving the output of the triangular waveform oscillation circuit and generating a tangent waveform, and
wherein the tangent waveform from the tangent waveform generator is output as the modulation waveform.

8. The clock generator according to claim 1,
wherein the modulation waveform generation unit comprises:
a triangular waveform oscillation circuit oscillating and outputting a triangular waveform;
a tangent waveform generator receiving the output of the triangular waveform oscillation circuit and generating a tangent waveform;
a first level setting circuit adjusting the level of output of the triangular waveform oscillation circuit;
a second level setting circuit adjusting the level of output of the tangent waveform generator; and
an adder adding the output of the first level setting circuit to the output of the second level setting circuit,
wherein an input is made to the tangent waveform generator, and
wherein the output of the adder is output as the modulation waveform of the modulation waveform generation unit.

9. A semiconductor device comprising the clock generator according to claim 1.

* * * * *